United States Patent [19]
Chau

[11] Patent Number: 5,163,020
[45] Date of Patent: Nov. 10, 1992

[54] HIGH SPEED BICMOS CONDITIONAL SUM ADDER

[75] Inventor: Kwok K. Chau, Dallas, Tex.

[73] Assignee: Texas Instruments Incorporated, Dallas, Tex.

[21] Appl. No.: 685,579

[22] Filed: Apr. 15, 1991

[51] Int. Cl.[5] .................... G06F 7/50; H03K 19/02
[52] U.S. Cl. .................................. 364/788; 307/446
[58] Field of Search .............. 364/788, 784, 786; 307/446, 570

[56] References Cited

U.S. PATENT DOCUMENTS

| | | | |
|---|---|---|---|
| 4,678,943 | 7/1987 | Uragami et al. | 307/446 X |
| 4,689,503 | 8/1987 | Suzuki et al. | 307/446 |
| 4,918,640 | 4/1990 | Heimsch et al. | 364/784 |
| 4,937,480 | 6/1990 | Higuchi et al. | 307/446 X |
| 5,047,976 | 9/1991 | Goto et al. | 364/788 |

OTHER PUBLICATIONS

Rothermel et al., "Realization of Transmission-Gate Conditional-Sum (TGCS) Adders with Low Latency Time", *IEEE Journal of Solid-State Circuits*, vol. 24, No. 3, Jun. 1989, pp. 558-561.

J. Sklansky, "Conditional-Sum Addition Logic", *IRE Transactions on Electronic Computers*, Jun. 1960, pp. 226-231.

Gallia et al, "BiCMOS ASIC for High Performance Systems", pp. 1-4 May 1990.

*Primary Examiner*—Long T. Nguyen
*Attorney, Agent, or Firm*—Ira S. Matsil; B. Peter Barndt; Richard L. Donaldson

[57] ABSTRACT

An N-bit conditional sum adder 8 includes first and second conditional sum adders $10a$ and $10b$. Each of the adders may be built from a plurality of one-bit conditional sum adders 110. In one embodiment, each one-bit adder 110 comprises a XNOR gate 50, a XOR gate 52, a NAND gate 54 and a NOR gate 56. The carry outputs $CO_a$ and $CO_b$ of the first conditional sum adder $10_a$ are coupled to BiCMOS drivers 12 and 14 which in turn are coupled to the select inputs of a plurality of multiplexers 16 and 18. The multiplexers may be CMOS multiplexers built from transmission gates.

14 Claims, 6 Drawing Sheets

HIGH SPEED BICMOS CONDITIONAL SUM ADDER

FIELD OF THE INVENTION

This invention generally relates to semiconductor devices and specifically to a high speed static adder.

BACKGROUND OF THE INVENTION

One of the main concerns of computer design is obtaining the highest possible operating speed. An adder plays a central role in the operation of computers as well as numerous other systems, and is thus a major factor in determining the overall speed of many systems.

A number of fast adders have been developed. The simplest form of parallel adder is the ripple-carry adder which accepts the two numbers to be summed and a carry-in as inputs and creates a sum and a carry-out bit. In this case, each bit of the addend and augend is fed into a full adder along with the carry out of the next highest significant bit. In the worst possible case, the carry may have to propagate, ie. "ripple-through", the adder from one end to another, thus causing a long delay. If a large number of bits must be added, such as 64 or 128, this delay may be intolerable.

Another type of adder is the minimum delay adder which takes advantage of the basic theorem that any Boolean function, no matter how complex, may be realized in a second-order form. In this case, there is no ripple-through delay. The number of logic gates required, however, is far too large to make a practical adder. For example, a 64-bit adder would require over $10^{20}$ gates—obviously an impractical situation.

The carry look-ahead adder combines the concepts of the carry-propagate and minimum delay adders to reach compromise between the delay time and the number of gates. Although better than the two previous examples, the carry look-ahead adder is still not sufficient for many high speed, multi-bit applications.

The conditional sum adder is a well known adder which is faster than the previously mentioned adders. In this case, the sum and carry-out of each bit are computed twice for both carry-in equal to zero and carry-in equal to one. Groups of two sums and carry-outs are then formed. Within each group, the carry-out of the least significant half is used to select the new sum and carry-out of the most significant half. This operation of grouping of 4-bit, 8-bit, 16-bit, etc. is repeated until the group size matches the adder word length.

Although in theory, the conditional sum adder is the fastest adder, the speed is often limited by the high fanout nets in the critical path (the carry-out of the least significant half in a group has to select all the sums and carry-outs of the most significant half). In prior art applications, people have tried to build conditional sum adders with multiple cascaded CMOS buffers in order to drive the high fanout nets. The additional buffers introduce more delay into the critical path. Also, the word length dependent customized buffers also break the basically regular structure of the conditional sum adder and thus complicate the layout and fabrication of the device.

Accordingly, improvements which overcome any or all of the problems are presently desirable.

SUMMARY OF THE INVENTION

Other objects and advantages will be obvious, and will in part appear hereinafter and will be accomplished by the present invention which provides an apparatus for a high-speed static adder.

An N-bit conditional sum adder comprises first and second N/2-bit conditional sum adders. Each of the adders may be built from a plurality of one-bit conditional sum adders. In one embodiment, each one-bit adder comprises a XNOR gate, a XOR gate, a NAND gate and a NOR gate. The carry outputs of the first conditional sum adder are coupled to BiCMOS drivers which in turn are coupled to the select inputs of a plurality of multiplexers. The multiplexers may be CMOS multiplexers built from transfer gates.

An advantage of the invention is that the adder will have both high speed and a relatively low number of logic gates. Since BiCMOS logic gates are used to generate the initial sums and carry-outs for both the "with" and "without" carry-in cases, these gates are able to provide high initial drive to propagate the sums and carry-outs through multiple levels of multiplexers.

The present invention is also flexible enough to enable the use of CMOS transmissions gates for the multiplexers. These gates are used for rapid signal propagation.

Another advantage of the present invention is that it may be easily built from BiCMOS gate arrays. A gate array is an array of transistor circuits which utilize the same base cell for many different applications. In this configuration, only the final interconnection levels of the multilevel device are specifically designed for any given application. The initial levels, known as the base cell, are the same for each implementation. Since the base cell already exists, only the final interconnects must be designed to built different word length adders.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus of the present invention. A block diagram of the preferred embodiment will be described first followed by a description of embodiments of the component parts. Several performance advantages will then be discussed.

Figure 1:
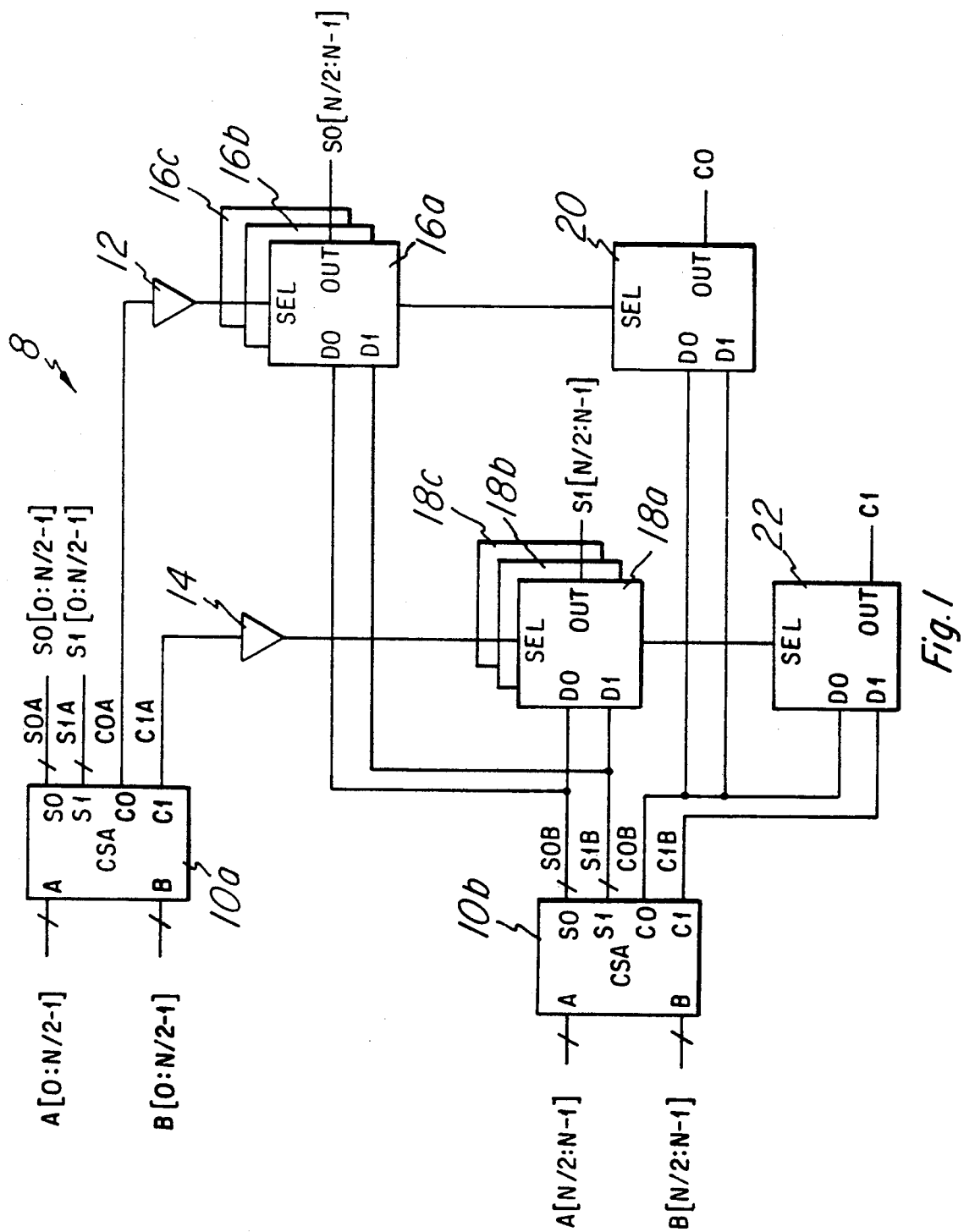
FIG. 1 is block diagram of a conditional sum adder (CSA)

FIG. 1 illustrates a block diagram of an N-bit Conditional Sum Adder (CSA) 8. The integer N, signifying the number of bits to be added, may typically but not necessarily be a factor of two or more typically a power of two such as 32, 64 or 128 as examples. The Conditional Sum Adder 8 comprises three major components: CSA, BiCMOS buffer and CMOS multiplexer. These components will be discussed in detail with reference to FIGS. 2-4.

Referring now to FIG. 1 two N-bit numbers A and B are input to the Conditional Sum Adder 8. The least significant bits A[0:N/2-1] and B[0:N/2-1] are input to a first Conditional Sum Adder 10a. The outputs S0a and S1a will be the final sum outputs S0 or S1 in the case that the original carry is "0" for S0 or "1" for S1. The carry-outs of the first Conditional Sum Adder 10a, C0a and C1a are coupled to BiCMOS buffers 12 and 14, respectively. The value of the bits C0a and C1a will determine the choice for the most significant final sum bits, as is well known with Conditional Sum Adders.

BiCMOS buffer 12 is coupled to the select input SEL of a plurality of multiplexers labeled in FIG. 1 as 16a through 16c. In a preferred embodiment buffer 12 may comprise more than one buffer such as two BiCMOS inverters for example. In all, there will be N/2 multiplexers coupled to BiCMOS buffer 12. Likewise, BiCMOS buffer 14 (which may comprise more than one buffer) is coupled to the select input SEL of a second plurality of multiplexers labeled as 18a through 18c. There are also N/2 multiplexers coupled to buffer 14. Although drawn with only one select input SEL, each multiplexer 16 (or 18) may have both true and complement select signals.

Since it is possible to have a large fanout if the word length, i.e., the number of bits N, is large, BiCMOS buffers 12 and 14 are used. For example, if a 64 bit addition is required, then each buffer 12 (or 14) must drive the select input on 32 multiplexers. As another example, if a 128 bit addition is required, then each buffer 12 (or 14) must drive the select input on 64 multiplexers. Prior art methods cannot handle this requirement without large delay costs.

The most significant bits of the inputs A[N/2:N-1] and B[N/2:N-1] are coupled to the N/2 bit CSA 10b. Each output bit S0b (there will be N/2 output bits in total) of the second CSA 10b, is coupled to one of the inputs D0 of the plurality of multiplexers 16a through 16c. Likewise, each of the N/2 output bits S1b is coupled to the input D1 of one corresponding multiplexer 18. The value of the least significant carry bits C0 and C1 will determine the choice for the final sum S0 and S1 outputs.

Multiplexer 20 is provided to determine the final carry-out C0 if the original carry is "0". The two data inputs D0 and D1 to multiplexer 20 are coupled to carry outputs C0b and C1b of the CSA 10b, respectively. The select input SEL of multiplexer 20 is also driven by the output of buffer 12. Likewise, multiplexer 22 is provided to determine the carry-out if the original carry-out C1 if the original carry is "1". The two data inputs D0 and D1 of multiplexer 22 are coupled to carry outputs are also coupled to carry outputs C0b and C1b of CSA 10b, respectively. The select input SEL of multiplexer 22 is driven the output of buffer 14.

It should be noted the final input and output configuration of N-bit CSA 8 are in the same format as N/2-bit CSAs 10a and 10b. Therefore, a CSA of any power of two bits may be implemented by simply incorporating two CSAs with half the number of bits along with the corresponding buffer and multiplexer circuitry. This modular design capability provides another advantage over the prior art.

It should be further noted that the illustrative N-bit conditional sum adder 8 is formed from two N/2-bit CSAs 10a and 10b. In a more general application, an N-bit CSA may formed from a W1-bit CSA and a W2-bit CSA, where W1 and W2 are positive integers whose sum is N. For example, a 15-bit CSA may be built from an 8-bit CSA and a 7-bit CSA. Likewise, the 8-bit CSA may be built from two 4-bit CSAs and the 7-bit CSA built from a 4-bit CSA and a 3-bit CSA, and so on. In another example, the 15-bit CSA may be built from a 10-bit CSA and a 5-bit CSA. The size of the lowest level CSA is determined by design choice.

Next, each of the major component blocks, namely the CSA 10, the BiCMOS buffer 12 (or 14) and the multiplexer 16 (or 18 or 20 or 22), will be discussed.

As previously discussed, any CSA may be built using two CSAs with half the number of bits. As such, a major building block for all CSAs is the 1-bit CSA. An example of a 1-bit CSA built with standard logic gates is shown in FIG. 2a.

Figure 2A:
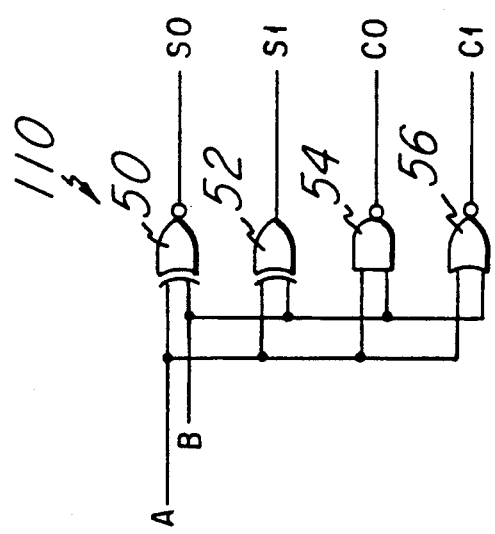
FIG. 2a is functional diagram of a 1-bit CSA.

Referring now to FIG. 2a, two one bit binary numbers A and B are to be added. As is well known to those in the art, the sum S0 of the two bits A and B if the carry is zero is determined by exclusive NOR gate 50. Likewise, the sum S1 if the carry bit is one is determined by exclusive OR gate 52. In addition, the carry-out bit C0 if the carry-in is zero is determined by NAND gate 54 and the carry-out bit C1 if the carry-in bit is one is determined by NOR gate 56. The logic design of the 1-bit CSA adder 110 can be determined using simple and well known logic design techniques.

The fabrication of logic gates 50 through 56 is also well known in the art. In a preferred embodiment, the logic gates 50 through 56 are also built from BiCMOS transistors since these devices have the highest drive capability. These transistors can be easily built using BiCMOS gate arrays.

Figure 2B:
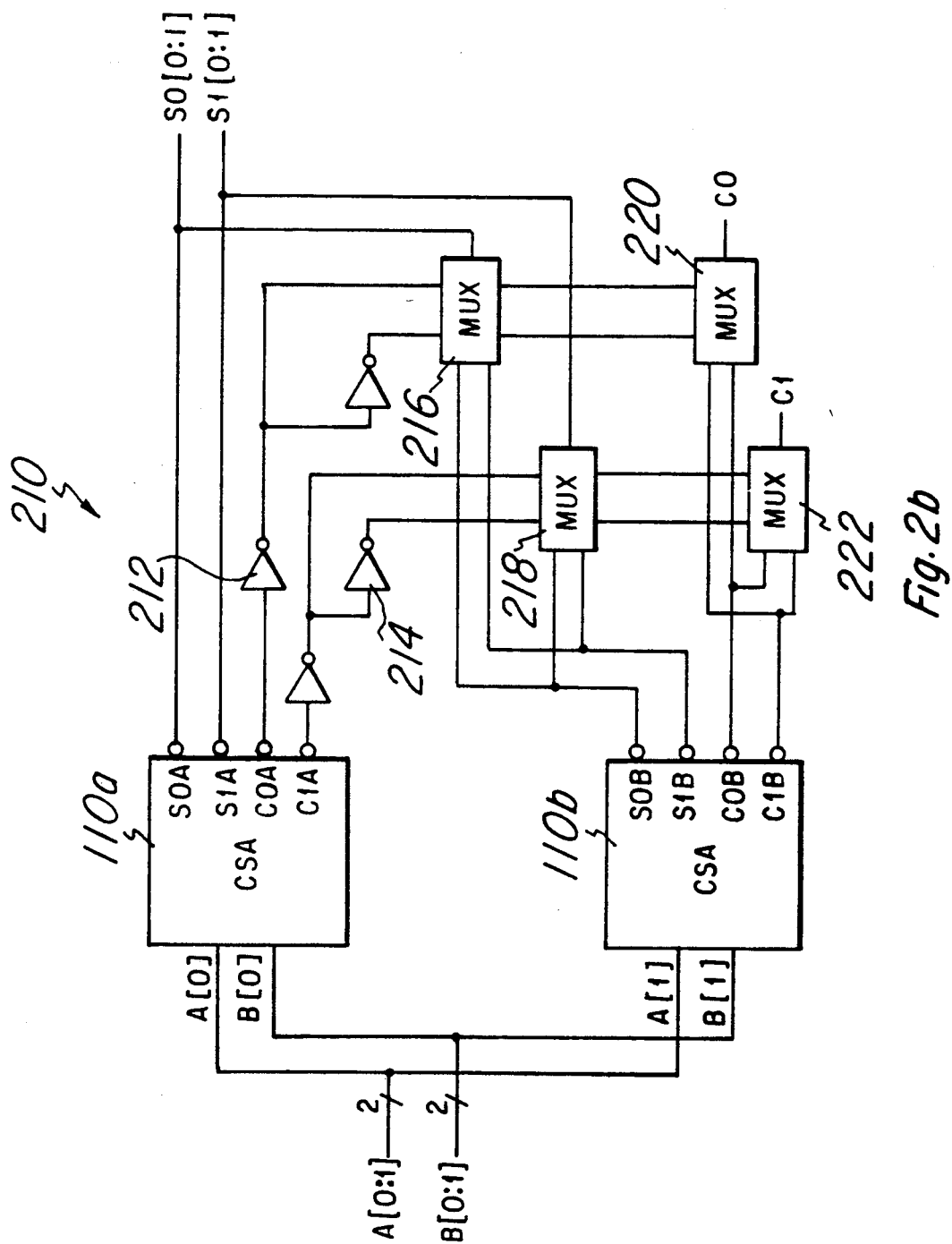
FIG. 2b is a block diagram of a multi-bit CSA.

A 2-bit Conditional Sum Adder 210 is illustrated in FIG. 2b. This 2-bit CSA 210 has the same configuration as the general N-bit CSA 10 described with respect to FIG. 1. The least significant input bits A[0] and B[0] are input to a 1-bit CSA 110a such as the one described with reference to FIG. 2a. Likewise, the most significant input bits A[1] and B[1] are input to 1-bit CSA 110b.

The sum outputs S0a and S1a of CSA 110a will be the least significant output bits S0[0] and S1[1] of the final sum. The carry-out bits C0a and C1a drive the inputs of BiCMOS buffers 212 and 214, respectively. The remaining output sum bits S0[1] and S1[1] as well as the carry-out bits are determined as described with reference to the N-bit CSA.

Figure 3:
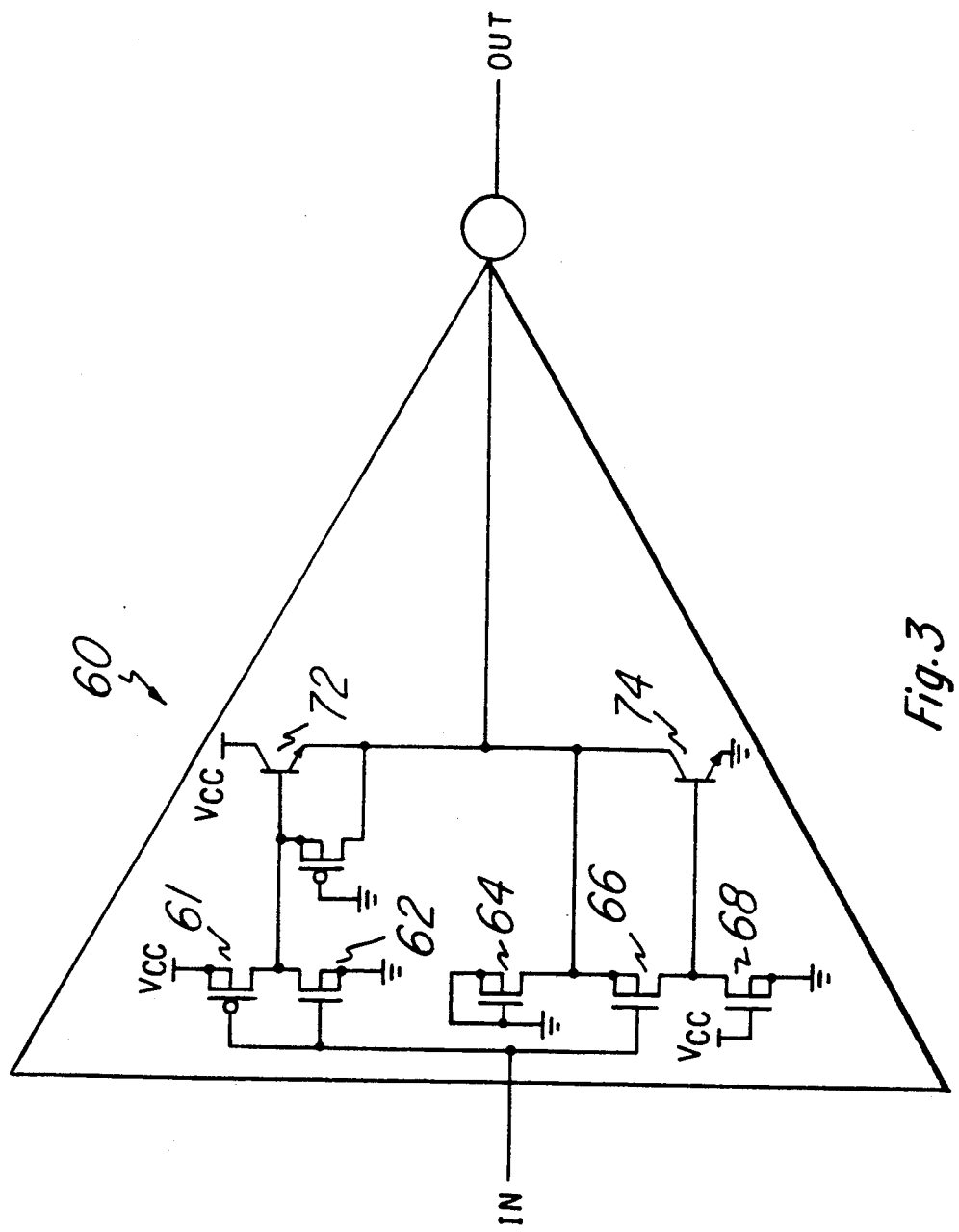
FIG. 3 is a circuit diagram of a BiCMOS buffer.

Referring now to FIG. 3, the circuit diagram for a BiCMOS buffer 60 is shown. The buffer 60 is a BiCMOS inverter formed from p-channel MOS transistors 61 and 70, n-channel MOS transistors 62, 64, 66 and 68 and bipolar junction transistors 72 and 74. The output signal OUT will be an inverted version of the input signal N.

Figure 4A:
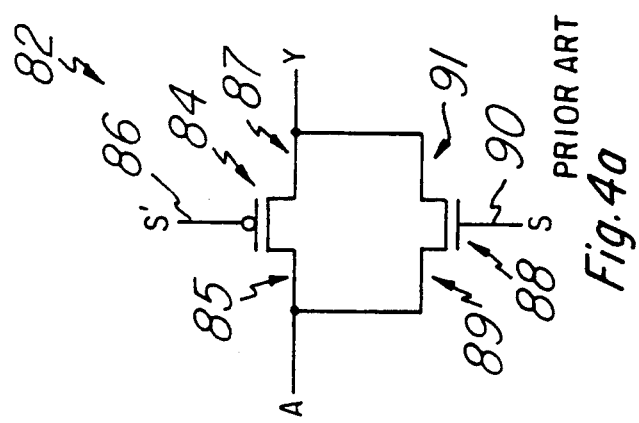
FIG. 4a is a circuit diagram of a CMOS transmission gate.
Figure 4B:
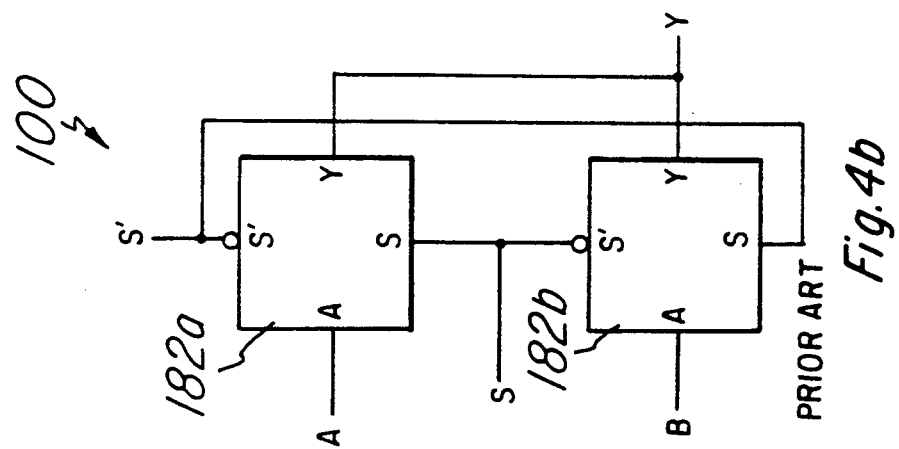
FIG. 4b is a block diagram of a multiplexer.

FIG. 4a illustrates a transmission gate 82 which may be used to form a multiplexer as shown in FIG. 4b. The CMOS transmission gate 82 comprises p-channel MOS transistor 84 and n-channel MOS transistor 88. The input A is coupled to the source 85 of p-channel transistor 84 and the source 89 of n-channel transistor 88. The drain 87 of p-channel transistor 84 is connected to the drain 91 of n-channel transistor 88 and this node serves as the output Y. The select input S is coupled to the gate 90 of n-channel transistor 88 and the complement of the select input S' is coupled to the gate 86 of p-channel transistor 84. When the select input S is high, the output Y will have the value of input A.

As shown in FIG. 4b, two transmission gate 182a and 182b may be configured to form a multiplexer 100. The first input A is coupled to the input of first multiplexer 182a and the second input B is connected to the input of second multiplexer 182b. The select input S is coupled to the select input of gate 182a and the complement select input S' of gate 182b. Likewise, the complement select input S' is coupled to the complement select of gate 182a and the select input of gate 182b. The output Y will take on the value of A is the select input S is high or the value of B if the select input S is low, i.e., the complement select input S' is high.

Figure 5A:
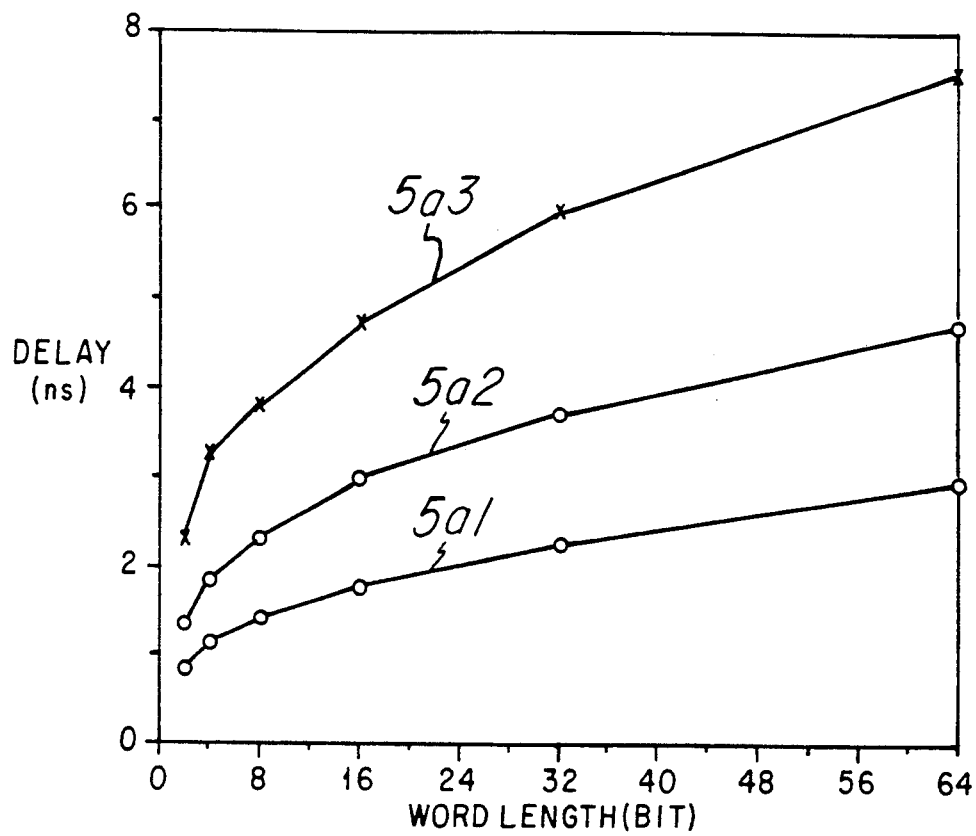
FIG. 5a is a graph showing the delay as a function of word length.
Figure 5B:
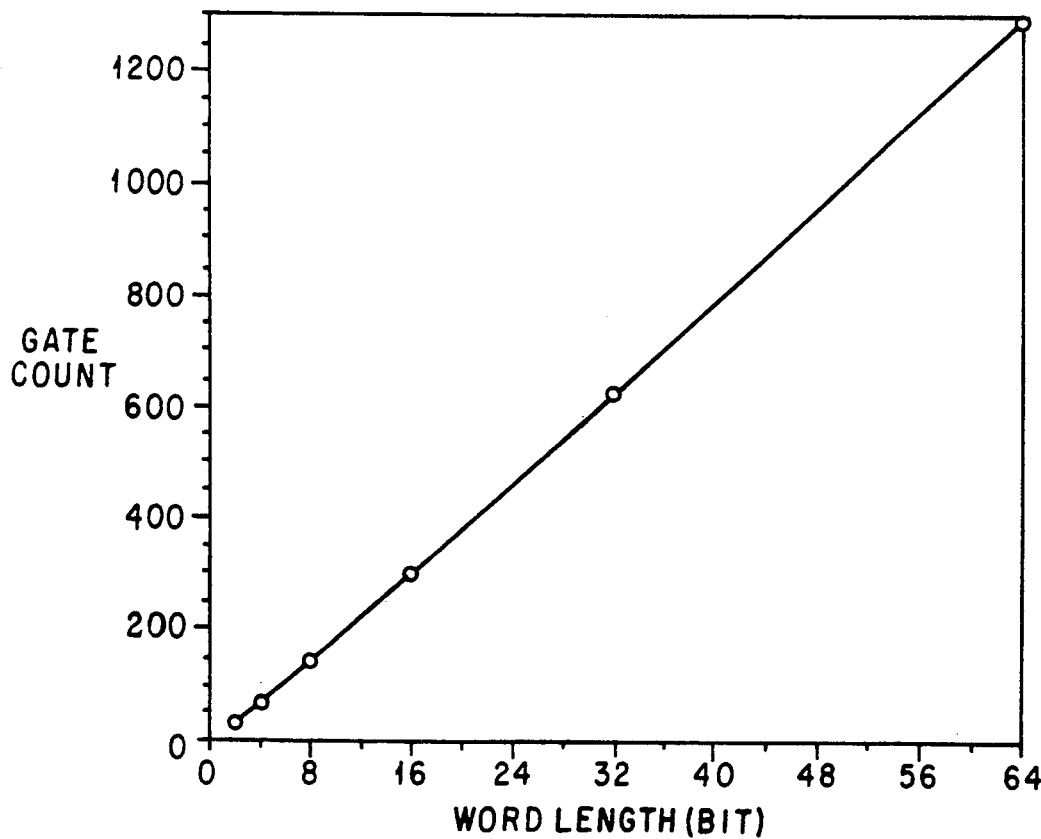
FIG. 5b is a graph showing the gate count as a function of word length.

The performance of a conditional sum adder built using the concepts of the present invention is shown in FIG. 5a which illustrates the delay as a function of word length and in FIG. 5b which illustrates the gate count as a function of word length. As will be readily recognized by those skilled in the art, the capabilities of the CSA of the present invention are superior to the capabilities of prior art methods.

Referring now to FIG. 5a, the gate delay for three different cases is shown as the function of word length. Specifically, Graph 5a1 illustrates the case of 0.6 micron transistor circuit, Graph 5a2 illustrates a 0.8 micron transistor circuit under nominal conditions and Graph 5a3 illustrates a 0.8 micron transistor circuit under worst case conditions. Here the delay is roughly proportional to the log of N, where N is the word length in bits.

For example, the nominal delays with the 0.8 micron BiCMOS circuit are 3.69 ns for 32 bits and 4.64 ns for 64 bits. These delays are base on standard 100k BiCMOS gate array transistor sizes. In this example, all p-channel transistors are 15.6 microns, all n-channel transistors are 13.0 microns and all bipolar transistors are 4.8 microns squared. This example is given to show that very high speed adders can be made in a BiCMOS gate array environment. Even better performance is expected with transistor sizing on custom chips.

The gate count as a function of word length is illustrated in FIG. 5b. An important fact to note is that the gate count increases linearly as the word length gets larger. This is an advantage over many prior art adders in which the gate count increases exponentially as the word length gets larger.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An N-bit conditional sum adder comprising:
    a W1-bit conditional sum adder and a W2-bit conditional sum adder, wherein N is the number of bits to be added and wherein the W1 and W2 are integers whose sum is N, and wherein said W1-bit adder includes W1 inputs and W2-bit adder includes W2 inputs and wherein each of said conditional sum adders includes a carry-zero output, a carry-one output, at least one sum-zero output and at least one sum-one output and wherein said W1-bit conditional sum adder includes at least one 1-bit conditional sum adder wherein said 1-bit conditional sum adder has a first and second input, a carry-zero output, a carry-one output, a sum-zero output and a sum one output and wherein said 1-bit conditional sum adder comprises a plurality of logic gates including:
    an exclusive NOR gate with an output coupled to said sum-zero output of said 1-bit conditional sum adder;
    an exclusive OR gate with an output coupled to said sum-one output of said 1-bit conditional sum adder;
    a NAND gate with an output coupled to said carry-zero output of said 1-bit conditional sum adder; and
    a NOR gate with an output coupled to said carry-one output of said 1-bit conditional sum adder;
    wherein said first and second inputs are coupled to the inputs of said exclusive NOR gate, said exclusive OR gate, said NAND gate and said NOR gate, respectively;
    first and second BiCMOS (bipolar and complementary metal oxide semiconductor) buffers, an input of said first buffer coupled to said carry-zero output of said W1-bit adder, and an input of said second buffer coupled to said carry-one output of said W1-bit adder;
    a first plurality of W2 multiplexers, each of said multiplexers comprising a select input, a data-one input and a data-two input, wherein an output of said first buffer is coupled to said select input of each of said first plurality of multiplexers; and
    a second plurality of W2 multiplexers, each of said multiplexers comprising a select input, a data-one input and a data-two input, wherein an output of said second buffer is coupled to said select input of each of said second plurality of multiplexers and wherein said at least one sum zero output of said W2-bit conditional sum adder is coupled to said data-one inputs of said first and said second plurality of W2 multiplexers and wherein said at least one sum-one output of said W2-bit conditional sum adder is coupled to said data-two inputs of said first and said second plurality of W2 multiplexers;
    wherein least significant sum outputs of said N-bit adder is taken from said sum zero and sum-one outputs of said W1-bit adder and wherein most significant sum outputs of said N-bit adder are taken from outputs of first and second plurality of W2 multiplexers.

2. The N-bit adder of claim 1 wherein W1 is equal to W2.

3. The N-bit adder of claim 1 wherein N is a power of 2.

4. The N-bit adder of claim 3 wherein N is equal to 64.

5. The N-bit adder of claim 3 wherein N is equal to 128.

6. The N-bit adder of claim 1 wherein said logic gates comprise BiCMOS logic gates.

7. The N-bit adder of claim 1 wherein said each of said W1-bit conditional sum adder comprises a W3-bit conditional sum adder and a W4-bit conditional sum adder, wherein the sum of W3 and W4 is W1.

8. The N-bit adder of claim 1 wherein said each of said W2-bit conditional sum adder comprises a W3-bit conditional sum adder and a W4-bit conditional sum adder, wherein the sum of W3 and W4 is W2.

9. The N-bit adder of claim 1 wherein said W2-bit conditional sum adder comprises a plurality of 1-bit conditional sum adders, wherein each of said 1-bit conditional sum adders has first and second inputs, and a carry-zero output, a carry-one output, a sum-zero output and a sum-one output.

10. The N-bit adder of claim 9 wherein each of said 1-bit adders comprises:
an exclusive NOR gate with an output coupled to said sum-zero output;
an exclusive OR gate with an output coupled to said sum-one output;
a NAND gate with an output coupled to said carry-zero output; and
a NOR gate with an output coupled to said carry-one output;
wherein said first and second inputs are coupled to the inputs of said exclusive NOR gate, said exclusive OR gate, said NAND gate and said NOR gate, respectively.

11. The N-bit adder of claim 1 wherein said multiplexers comprise complementary metal oxide semiconductor (CMOS) multiplexers.

12. The N-bit adder of claim 11 wherein each of said CMOS multiplexers comprises a plurality of CMOS transmission gates.

13. The N-bit adder of claim 12 wherein said each of said CMOS transmission gates comprises an n-channel MOS transistor and a p-channel MOS transistor.

14. The N-bit adder of claim 1 and further comprising first and second multiplexers, wherein each of said multiplexers includes a select input, a data-one input and a data-two input, wherein said select input of said first multiplexer is coupled to the output of said first buffer and said select input of said second multiplexer is coupled to the output of said second buffer, and wherein said carry-zero output of said second adder is coupled said data-one input of each of said first and second multiplexers and wherein said carry-one output of said second adder is coupled said data-two input of each of said first and second multiplexers and wherein an output of said first multiplexer comprises a carry-zero output of said N-bit conditional sum adder and an output of said second multiplexer comprises a carry-one output of said N-bit conditional sum adder.

* * * * *